United States Patent [19]

Latasiewicz et al.

[11] 4,159,506
[45] Jun. 26, 1979

[54] MOUNTING ARRANGEMENT FOR CHASSIS AND PRINTED CIRCUIT BOARD WITH METHOD OF ASSEMBLY

[75] Inventors: Leonard Latasiewicz, Hoffman Estates; Peter F. Stultz, Des Plaines, both of Ill.

[73] Assignee: Motorola, Inc., Schaumburg, Ill.

[21] Appl. No.: 823,901

[22] Filed: Aug. 12, 1977

Related U.S. Application Data

[62] Division of Ser. No. 692,615, Jun. 3, 1976.

[51] Int. Cl.² .............................................. H05K 00/00
[52] U.S. Cl. ...................................... 361/399; 361/419
[58] Field of Search ........................... 336/67; 338/317; 361/380, 395, 417, 419, 420, 424, 392, 427, 399

[56] References Cited

U.S. PATENT DOCUMENTS

| 2,699,531 | 1/1955 | Massar | 336/67 |
| 2,762,987 | 9/1956 | Mackey | 339/220 R |
| 2,898,518 | 8/1959 | Lynn | 339/17 C |
| 3,531,076 | 9/1970 | Bang | 338/317 |

Primary Examiner—Gerald P. Tolin
Attorney, Agent, or Firm—Margaret Marsh Parker; James W. Gillman

[57] ABSTRACT

An improved mounting arrangement and method of assembly provides for mounting parts on both chassis and board, then mating the two before soldering by means of a twist-tab-and-slot arrangement. The conformation and dimensions of the tab and slot prevent warpage during soldering, enabling the use of the chassis as a board carrier in the wave soldering process.

5 Claims, 5 Drawing Figures

MOUNTING ARRANGEMENT FOR CHASSIS AND PRINTED CIRCUIT BOARD WITH METHOD OF ASSEMBLY

This is a division of application Ser. No. 692,615, filed June 3, 1976.

BACKGROUND OF THE INVENTION

This invention relates to the field of electronic apparatus assembly and specifically to an arrangement for mounting a printed circuit board to a chassis, then using the chassis as a board carrier during the waveline soldering process.

Increased automation of production lines has been a continuing goal in the electronics industry for some years. New impetus was added as components were miniaturized and new soldering methods were developed to eliminate hand soldering of each small component. It is known in the art to insert component leads into holes in an insulating board having most or all of its interconnections plated or printed on the board. The board is then fastened to a carrier or pallet which carries the board through the fluxing, soldering and cleaning steps on the production line. After these steps, the pallet is removed, the chassis fastened to the board and other components added and hand soldered. The use of pallets is costly for several reasons: relatively high original cost coupled with relatively short life, and the time and cost of labor required to attach, remove, clean, then move the pallets back to the point of attachment. Pallets continued to be used, however, since any known method of attaching the chassis to the printed circuit board before the soldering process would cause the board to warp due to the heat and stress. This warping frequently caused failures in the apparatus during testing or in use, due to minute cracks in the printed leads or loosened connections.

SUMMARY OF THE INVENTION

It is an object of the invention, therefore, to provide an improved mounting arrangement for a chassis and printed circuit board and a method of utilizing the arrangement.

It is a particular object to provide a mounting arrangement which will eliminate steps in the assembly process while at the same time improving the quality of the finished product.

The above objects are achieved in the present invention by the combination of printed circuit board slots and chassis parts which are shaped and dimensioned to (1) allow the chassis to be loosely attached to the printed circuit board before waveline soldering; (2) allow the chassis to function as a board carrier during the soldering process; and (3) prevent warpage of the board due to heating under stress.

DETAILED DESCRIPTION OF THE PREFERRED EMBODIMENT

Figure 1:
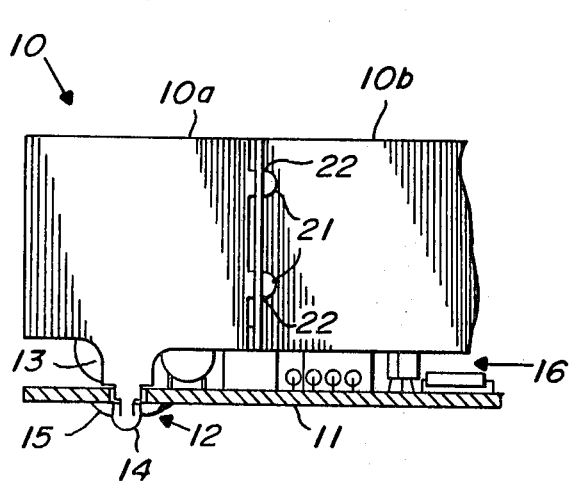
FIG. 1 is an elevational view of a portion of a chassis and printed circuit board mounting arrangement constructed according to the invention.

The mounting arrangement of the invention will be best understood in relation to the drawing in which like reference numerals are used throughout to indicate like parts. In FIG. 1 a side view of a chassis 10 and a printed circuit board 11 are shown as constructed, assembled and soldered according to the invention. The chassis 10 itself may be constructed in two parts 10a and 10b as will be described later. A tab, designated generally as 12 and having a shoulder portion 13 and a narrowed tab portion 14, has been inserted through the printed circuit board 11 and soldered (as at 15). It should be noted that, while one specified tab design is shown and described, other tab designs having the required characteristics could be used within the scope of the invention. These characteristics will be further described in relation to FIGS. 4a and 4b.

Figure 2:
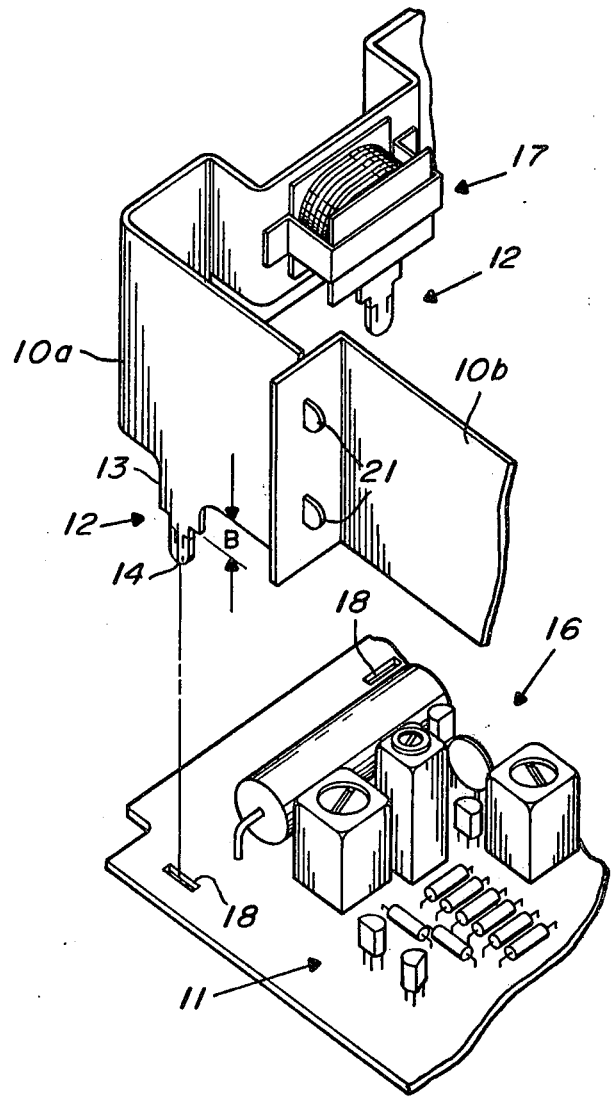
FIG. 2 is a perspective, exploded, partial view of the mounting arrangement of FIG. 1.

In FIG. 2, the mounting arrangement is shown prior to mating of the chassis 10 and the board 11 and the soldering step. The top surface of the board 11 supports a number of components 16, the leads of which have been inserted in apertures in the board. The board has been passed over a waveline waxer (not shown) to hold the leads of the components 16 in place, and over a cutter (not shown) to trim the component leads. All parts 17 (one shown) to be supported by the chassis 10 have been mounted and the chassis is ready to affix to the printed circuit board 11. The tabs 12 of the chassis 10 are then inserted in a like number of slots 18 in the printed circuit board. The slots 18 are positioned and dimensioned to provide a loose fit for the narrow portions 14 of the tabs 12.

Figure 4A:
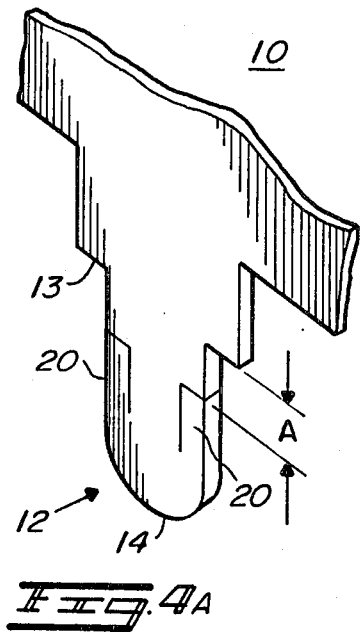
FIG. 4a is an enlarged perspective view of the mounting tab before twisting.
Figure 4B:
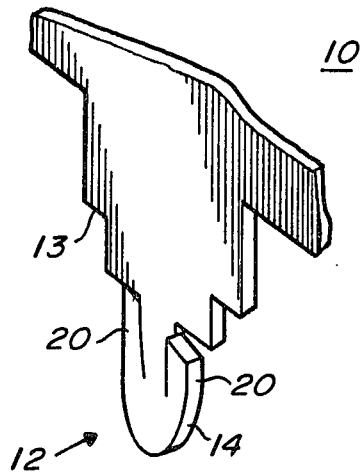
FIG. 4b is the tab of FIG. 4a after twisting.
Figure 3:
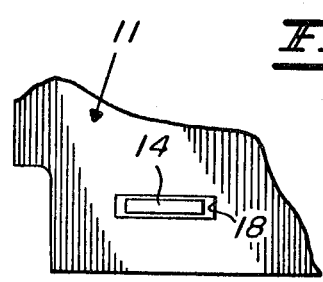
FIG. 3 is a bottom view of a portion of the board of FIG. 1 including one section of the mounting arrangement and showing the relative sizes of the tab and the printed circuit board slot.

In FIG. 3, the relative sizes of the narrow tab portion 14 and the slot 18 are indicated. In FIGS. 4a and 4b the details of the tabs 12 are shown before and after twisting of the end of the tab. After the chassis tabs 12 have been inserted in the printed circuit board 11, the ends of the tabs are twisted, preferably simultaneously and by machine for better control. The chassis 10 is held firmly during the twisting step but, because of the sizes of the tabs 12 and the slots 18, and the fact that the dimension "A" (FIG. 4a) is larger than the thickness of the printed circuit board material, no stress is applied to the board 11. Thus, the board is firmly retained by the twisted tabs 12, but has some mobility remaining in the plane of the board. Interconnections between board and chassis are then made and the chassis is gripped by a carrier (not shown) by means of the cut-away portions (indicated by dimension "B") of the chassis. Other means would be suitable for gripping the chassis according to the invention, but the cut-away portions "B" as shown are preferred for two reasons. First, is the simplicity and low cost of forming the cut-away portions "B" as the chassis portions are cut and formed. Second, is the fact that the cut-away portions "B" free valuable space on the printed circuit board 11 for placement of parts.

After twisting the end portions of the tabs 12, the small portions 20, the ends of which are now broken free, support but do not exert pressure on the board 11. As mentioned hereinbefore, the dimension "A" and the dimensions of the slot 18 allow sufficient room for the board to move slightly in the plane of the board. Additionally, in contrast to the type of twist tab (not shown) which is cut to provide a narrow or neck portion which twists within the slot, or an uncut tab 21 (FIGS. 1 and 2) such as may be used to hold the chassis portions together, the portion of the tab 12 which twists is outside the slot 18 and cannot cause binding pressure or stress on the printed circuit board material. As mentioned before, other tab designs having the above-described, non-binding characteristics, may be used in the present invention.

Production steps relating to the method of applying the invention are not illustrated since their structure is not critical to the invention. The printed circuit board 11 is fabricated with apertures and plated areas as is well known in the art. The leads of the small components 16 are inserted in the small apertures in the board and the board is then fluxed to prepare the appropriate areas to be soldered. The board then passes over a wave of wax which covers the bottom side of the board and holds the component leads firmly in place. This step also eliminates the necessity of a cleaning step in the assembly. In the next step, the board passes over a cutter which removes excess lead lengths. Meanwhile, all components to be directly supported by the chassis 10 are mounted on the chassis walls. The chassis 10 is preferably made in two portions 10a and 10b which may be fastened together by the twist tabs 21 and an appropriate number of slots 22 (FIGS. 1 and 2) either before or after (preferably before) the chassis is attached to the printed circuit board. After the mating of the chassis 10 and the printed circuit board 11 is completed by the twisting of the ends of the tabs 12, electrical interconnections are made. The chassis is then picked up via the cut-away portions "B" by a carrier attached to a conveyor and propelled through the remaining assembly steps. The chassis and board may be subjected to another fluxing step to prepare the chassis-to-board interconnections for soldering. The next steps take the units through a preheater which helps to prevent warping and the waveline soldering process which washes the bottom of the board and the apertures with molten solder. The unit is essentially ready for testing at this point.

Briefly then, the invention comprises attaching a chassis to a printed circuit board in such a fashion that the combined unit can be conveyed through the soldering process without the use of a separate pallet, while achieving higher reliability in the finished product. Modifications and variations may be made while remaining within the spirit and scope of the appended claims.

What is claimed is:

1. A mounting arrangement for an electronic apparatus for use with a conveyor mechanism for a wave soldering operation and including in combination an insulated circuit board having mounting apertures therein, the apertures being solder receptive, certain of the apertures having component leads protruding therethrough, a metal chassis comprising means for cooperating with said conveyor mechanism, and a plurality of tabs formed on an edge of said chassis and protruding through others of the apertures in said circuit board for loosely retaining said board, each tab having a body portion of a first predetermined cross-section, an end portion of the body portion being twistable, and being twisted after insertion through said board and a shoulder portion of a second predetermined cross-section, said second predetermined cross-section being larger than said first cross-section and also wherein the apertures in the insulated circuit board are larger than said first cross-section and smaller than said second cross-section, the length of the tab portion between the twistable portion and the shoulder portion is substantially greater than the thickness of said circuit board to allow some lateral motion of said board after said tab ends are twisted and the insulated circuit board is non-rigidly retained between the shoulder portion and the twisted end portion until the wave soldering operation is completed.

2. A mounting arrangement according to claim 1 wherein each tab has a twistable end portion which is formed by making two L-shaped cuts in the body portion wherein the bottom section of each L-shaped cut is spaced apart from the shoulder portion a distance greater than the thickness of the circuit board and the side section of each L-shaped cut extends away from the shoulder portion.

3. A mounting arrangement according to claim 1 wherein the means for cooperating with said conveyor mechanism comprises cut out portions of said chassis edge adjacent the circuit board.

4. A mounting arrangement according to claim 1 wherein the chassis comprises at least two chassis segments and means mechanically attaching each segment to the others of said segments.

5. A mounting arrangement according to claim 4 wherein the attaching means comprise tabs formed on a second edge of one chassis segment and cooperating slots formed in another segment.

* * * * *